(12) United States Patent
Wang et al.

(10) Patent No.: US 10,741,633 B2
(45) Date of Patent: Aug. 11, 2020

(54) DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan, Hubei (CN)

(72) Inventors: Kan Wang, Hubei (CN); Cunjun Xia, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/464,268

(22) PCT Filed: Jan. 9, 2019

(86) PCT No.: PCT/CN2019/071017
§ 371 (c)(1),
(2) Date: May 26, 2019

(65) Prior Publication Data
US 2020/0203459 A1    Jun. 25, 2020

(30) Foreign Application Priority Data
Dec. 11, 2018    (CN) .......................... 2018 1 1510418

(51) Int. Cl.
*H01L 27/32* (2006.01)
*H01L 51/00* (2006.01)

(52) U.S. Cl.
CPC ........ *H01L 27/3276* (2013.01); *H01L 27/323* (2013.01); *H01L 51/0097* (2013.01); *H01L 2251/5338* (2013.01); *H01L 2251/5392* (2013.01)

(58) Field of Classification Search
None
See application file for complete search history.

(56) References Cited

U.S. PATENT DOCUMENTS

2019/0148667 A1* 5/2019 Han .................... G09F 9/301
345/173

\* cited by examiner

*Primary Examiner* — Herve-Louis Y Assouman
(74) *Attorney, Agent, or Firm* — Mark M. Friedman

(57) ABSTRACT

A display panel and a manufacturing method thereof are provided. The display panel has a display area, a non-display area, and a bendable connection area being located between the display area and the non-display area and connecting the display area with the non-display area. The display panel includes a substrate; an inorganic insulating layer disposed on the substrate, wherein in the bendable connection area, a plurality of recesses are defined in the inorganic insulating layer; an organic filling layer filled in the plurality of recesses in the inorganic insulating layer and having a concave curved surface; and a wiring layer disposed on the inorganic insulating layer, wherein a concave curved surface formed on the wiring layer corresponds to the concave curved surface of the organic filling layer in each of the recesses.

18 Claims, 3 Drawing Sheets

DISPLAY PANEL AND METHOD FOR MANUFACTURING SAME

FIELD OF INVENTION

The present disclosure relates to a technical field in displays, and particularly to a display panel and a method for manufacturing the same, which reduces breakage risks in a bendable connection area between a display area and a non-display area of the display panel.

BACKGROUND OF DISCLOSURE

An organic light emitting diode (OLED) display panel includes a main display area (including pixels, touch electrodes, etc.), a surrounding non-display area (including a gate driving circuit, a patterned interconnection circuit, etc.), and a display control module. It is required for two areas to be connected by wires arranged in a connection area. In order to implement narrow bezels in the OLED display panel, the wire area is folded, so that the surrounding non-display area is placed below the main display area, and a distance between the main display area and borders of the OLED device is shortened. However, when the connection area through which the wires pass is bent at a large angle, various layer components (for example, a wiring layer) in the connection area are subjected to stresses and are liable to be broken, which results in increased impedance of the wires or even short circuiting.

Therefore, it is necessary to develop a display panel in which a bendable connection area through which wires pass between a display area and a non-display area can withstand great stresses, thereby reducing breakage risks.

SUMMARY OF INVENTION

Technical Problem

An object of the present disclosure is to provide a display panel and a method for manufacturing same that reduce breakage risks of a bendable connection area between a display area and a non-display area of the display panel.

Technical Solutions

In order to solve the above technical problem, the present disclosure provides a display panel having a display area, a non-display area, and a bendable connection area located between the display area and the non-display area and connecting the display area with the non-display area, the display panel including:

a substrate;

an inorganic insulating layer disposed on the substrate, wherein in the bendable connection area, a plurality of recesses are defined in the inorganic insulating layer and form a pattern;

an organic filling layer filled in the plurality of recesses in the inorganic insulating layer, wherein a concave curved surface is formed on the organic filling layer in each of the recesses; and a wiring layer disposed on the inorganic insulating layer and covering the inorganic insulating layer and the organic filling layer in the plurality of recesses, wherein a corresponding concave curved surface is formed on the wiring layer on the organic filling layer in each of the recesses along with the concave curved surface of the organic filling layer.

In accordance with an embodiment of the present disclosure, a flat surface is formed on the wiring layer on a portion of the inorganic insulating layer where the recesses are absent.

In accordance with an embodiment of the present disclosure, the display panel further includes an organic protective layer disposed on the wiring layer in the bendable connection area to cover the wiring layer.

In accordance with an embodiment of the present disclosure, at the pattern, a surface of the inorganic insulating layer is hydrophilic or hydrophobic.

In accordance with an embodiment of the present disclosure, a cross-sectional pattern of each of the plurality of recesses is a rectangle, a trapezoid, an inverted trapezoid or a parallelogram.

In accordance with an embodiment of the present disclosure, each of the plurality of recesses is a hole, a polygon recess or a groove.

In accordance with an embodiment of the present disclosure, material of the organic filling layer is selected from the group consisting of an epoxy resin polymer and an acrylic polymer.

Another aspect of the present disclosure provides a method for manufacturing a display panel, the display panel having a display area, a non-display area, and a bendable connection area located between the display area and the non-display area and connecting the display area with the non-display area, the method including:

a step S10 of providing a substrate;

a step S20 of disposing an inorganic insulating layer on the substrate;

a step S30 of forming a plurality of recesses in the inorganic insulating layer in the bendable connection area, wherein the plurality of recesses form a pattern;

a step S40 of filling the plurality of recesses in the inorganic insulating layer with an organic filling layer, wherein a concave curved surface is formed on the organic filling layer in each of the recesses;

a step S50 of disposing a wiring layer on the inorganic insulating layer to cover the inorganic insulating layer and the organic filling layer in the plurality of recesses, wherein a concave curved surface is formed on the wiring layer on the organic filling layer in each of the recesses along with the concave curved surface of the organic filling layer.

In accordance with an embodiment of the present disclosure, a flat surface is formed on the wiring layer on a portion of the inorganic insulating layer where the recesses are absent.

In accordance with an embodiment of the present disclosure, the display panel further includes a step S60 of disposing an organic protective layer on the wiring layer in the bendable connection area to cover the wiring layer.

In accordance with an embodiment of the present disclosure, after the step S30, before the step (S40), the method further includes a step S34 of performing a plasma treatment or an ultraviolet light irradiation treatment on a surface of the inorganic insulating layer at the pattern, such that at the pattern, the surface of the inorganic insulating layer is hydrophilic or hydrophobic.

In accordance with an embodiment of the present disclosure, the step S40 includes a step of filling the plurality of recesses in the inorganic insulating layer with the organic filling layer by inkjet printing, wherein the concave curved surface is formed on the organic filling layer in each of the recesses.

Another aspect of the present disclosure provides a display panel having a display area, a non-display area, and a bendable connection area located between the display area and the non-display area and connecting the display area with the non-display area, the display panel comprising:

a substrate;

an inorganic insulating layer disposed on the substrate, wherein in the bendable connection area, a plurality of recesses are defined in the inorganic insulating layer and form a pattern;

an organic filling layer filled in the plurality of recesses in the inorganic insulating layer, wherein a concave curved surface is formed on the organic filling layer in each of the recesses; and a wiring layer disposed on the inorganic insulating layer and covering the inorganic insulating layer and the organic filling layer in the plurality of recesses, wherein a corresponding concave curved surface is formed on the wiring layer on the organic filling layer in each of the recesses along with the concave curved surface of the organic filling layer, and a flat surface is formed on the wiring layer on a portion of the inorganic insulating layer where the recesses are absent.

In accordance with an embodiment of the present disclosure, the display panel further includes an organic protective layer disposed on the wiring layer in the bendable connection area to cover the wiring layer.

In accordance with an embodiment of the present disclosure, at the pattern, a surface of the inorganic insulating layer is hydrophilic or hydrophobic.

In accordance with an embodiment of the present disclosure, a cross-sectional pattern of each of the plurality of recesses is a rectangle, a trapezoid, an inverted trapezoid or a parallelogram.

In accordance with an embodiment of the present disclosure, each of the plurality of recesses is a hole, a polygon recess or a groove.

In accordance with an embodiment of the present disclosure, material of the organic filling layer is selected from the group consisting of an epoxy resin polymer and an acrylic polymer.

Beneficial Effects:

In the display panel and the method for manufacturing the display panel of the present disclosure, the concave curved surface of the organic filling layer in each of the recesses of the inorganic insulating layer exhibits an uneven "crescent" shape, thereby making the wires on the inorganic insulating layer longer than the original lengths thereof and improving the bendability thereof. In addition, the organic protective layer is disposed on the wires to cover the wires in the bendable connection area, thereby reducing stresses applied on the wires and the breakage risks, and protecting the wires from an external environment. Furthermore, it is not required to apply a photoresist under the wires, so that a total thickness of the layers in the bendable connection area is reduced, thereby reducing the breakage risks during bending.

BRIEF DESCRIPTION OF DRAWINGS

The present disclosure described herein is by way of example only, with reference to the accompanying drawings.

DETAILED DESCRIPTION OF PREFERRED EMBODIMENTS

Figure 1:
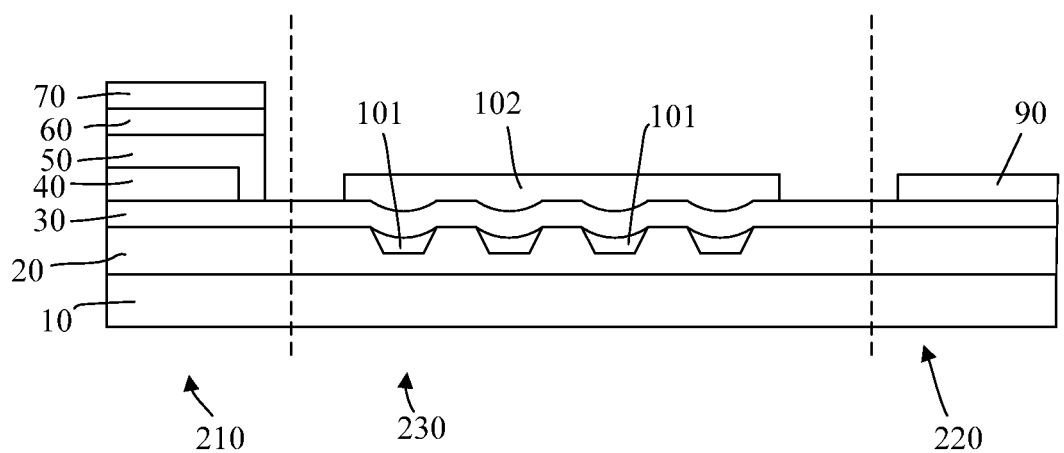
FIG. 1 is a schematic side view of a display panel in accordance with an embodiment of the present disclosure.

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

Embodiment 1

Referring to FIG. 1, which is a schematic side view of a display panel in accordance with an embodiment of the present disclosure.

In the present disclosure, a display panel 200 is provided and includes a substrate 10, an inorganic insulating layer 20, and a wiring layer 30. The display panel 200 is divided into a display area 210, a non-display area 220, and a bendable connection area 230.

The display area 210 of the display panel 200 is an area for displaying images, and may include various components most directly related to image display or touch sensing, such as an organic light emitting diode layer (OLED layer) 40 disposed on the wiring layer 30, an encapsulation layer 50 disposed on the OLED layer 40, a polarizing layer 60 disposed on the encapsulation layer 50, and a touch layer 70 disposed on the polarizing layer 60. However, the components directly related to the image display or the touch sensing are merely examples. Other components may be added as needed, or the components may be omitted or modified. Thus, the scope of the present disclosure should not be limited thereby.

The non-display area 220 of the display panel 200 is an area where no image is displayed, is generally located at the periphery of the display panel 200, and may include components which are not directly related to image display or touch sensing, such as a gate driving circuit (not shown), a patterned interconnection circuit (not shown), or a chip 80 disposed on the wiring layer 30, or a control module (not shown). However, the above components are merely examples. Other components may be added as needed, or the components may be omitted or modified. Thus, the scope of the present disclosure should not be limited thereby.

The bendable connection area 230 of the display panel 200 is located between the display area 210 and the non-display area 220, and connects the display area 210 with the non-display area 220. The bendable connection area 230 has wires formed with the wiring layer 30, and electrically connects the components in the display area 210 with the components in the non-display area 220 to transmit signals to each other.

The inorganic insulating layer 20 is disposed on the substrate 10, and has a thickness of 1 to 100 micrometers. In the bendable connection area 230, a plurality of recesses are defined in the inorganic insulating layer 20, and the plurality of recesses form a pattern. Material of the inorganic insulating layer 20 is selected from, but not limited to, SiNx, SiOxNy or SiOx. At the pattern, a plasma treatment ($H_2$, $O_2$, $NH_3$, N, etc.) or an ultraviolet light irradiation treatment is performed on a surface of the inorganic insulating layer 20, such that at the pattern, the surface of the inorganic insulating layer 20 is modified and exhibits hydrophilicity or hydrophobicity. A cross-sectional pattern of each of the plurality of recesses is a rectangle, a trapezoid, an inverted trapezoid or a parallelogram, and each of the plurality of recesses is a hole, a polygon recess or a groove.

An organic filling layer 101 is filled in the plurality of recesses in the inorganic insulating layer 20, wherein a concave curved surface is formed on the organic filling layer 101 in each of the recesses. Based upon hydrophilicity or hydrophobicity exhibited by the modified surface of the inorganic insulating layer 20, a suitable inkjet material, such as an epoxy resin polymer or an acrylic polymer, is selected. By an inkjet printing process, the plurality of recesses in the inorganic insulating layer 20 are filled with the organic filling layer 101, and the organic filling layer 20 does not overflow the recesses. Afterwards, the organic filling layer 20 is cured, so that the concave curved surface is formed on the organic filling layer 101 in each of the recesses. Therefore, a cross-sectional pattern of the organic filling layer 101 in each of the recesses is a crescent shape. The thickness of the organic filling layer 101 at edges of the plurality of recesses is greater than the thickness of the organic filling layer 101 at the center of the plurality of recesses. In addition, an insulating property is required for the organic filling layer 101.

The wiring layer 30 is disposed on the inorganic insulating layer 20 and covers the inorganic insulating layer 20 and the organic filling layer 101 in the plurality of recesses, wherein a corresponding concave curved surface is formed on the wiring layer 30 on the organic filling layer 101 in each of the recesses along with the concave curved surface of the organic filling layer 101, and a flat surface is formed on the wiring layer 30 on a portion of the inorganic insulating layer 20 where the recesses are absent. The wiring layer 30 may be formed by physical vapor deposition (PVD) or sputtering, and material thereof is selected from, but not limited to, Al, Ti, Cu, indium tin oxide (ITO) or indium zinc oxide (IZO).

In accordance with an embodiment of the disclosure, the display panel 200 further includes an organic protective layer 102 disposed on the wiring layer 30 in the bendable connection area and covering the wiring layer 30. Similar to the manner in which the organic filling layer 101 is formed, a suitable inkjet material, such as an epoxy-based polymer or an acrylic-based polymer, is selected. By an inkjet printing process, the organic protective layer 102 is formed on the wiring layer 30 in the bendable connection area. In addition, an insulating property is required for the organic protective layer 102. The thickness thereof is from 1 to 100 µm.

Figure 2:
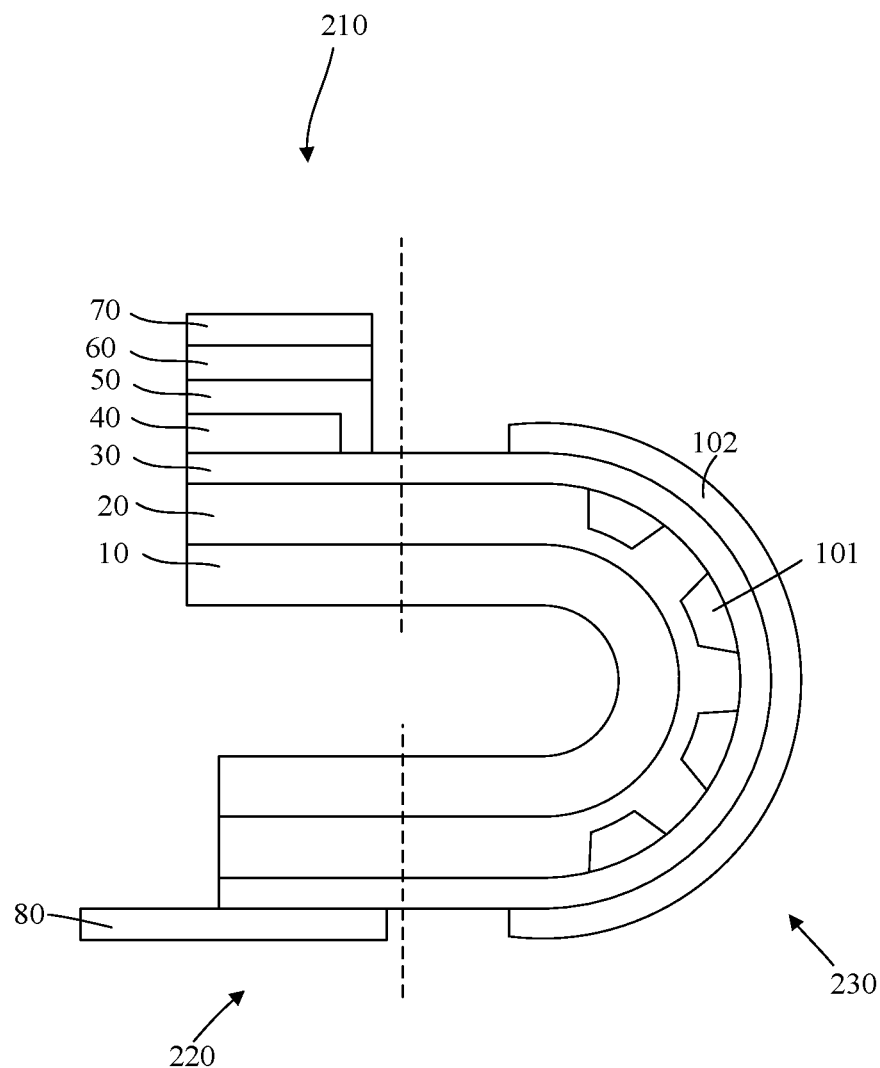
FIG. 2 is a schematic side view of the display panel after a bendable connection area is folded in accordance with the embodiment of the present disclosure.

Referring to FIG. 2, which is a schematic side view of the display panel after the bendable connection area is folded in accordance with the embodiment of the present disclosure. Due to a specific concave curved structure of the organic filling layer 101, such as a crescent shape, the lengths of the wires are increased, and the wires are more able to withstand bending. The organic filling layer 101 and the organic protective layer 102 are respectively present on upper and lower surfaces of the wires for adjusting stresses in the bendable area, and enhancing the flexibility of the wires. Moreover, the organic protective layer 102 also provides protection, and prevents the wires from being damaged by an external environment, which may cause impedance increase or a short circuit.

In summary, in the display panel of the present disclosure, the concave curved surface of the organic filling layer in each of the recesses of the inorganic insulating layer exhibits an uneven crescent shape, thereby making the wires on the inorganic insulating layer longer than the original lengths thereof and improving the bendability thereof. In addition, the organic protective layer is disposed on the wires to cover the wires in the bendable connection area, thereby reducing stresses applied on the wires and breakage risks, and protecting the wires from the external environment. Furthermore, it is not required to apply a photoresist under the wires, so that a total thickness of the layers in the bendable connection area is reduced, thereby reducing the breakage risks during the bending.

Embodiment 2

Figure 3:
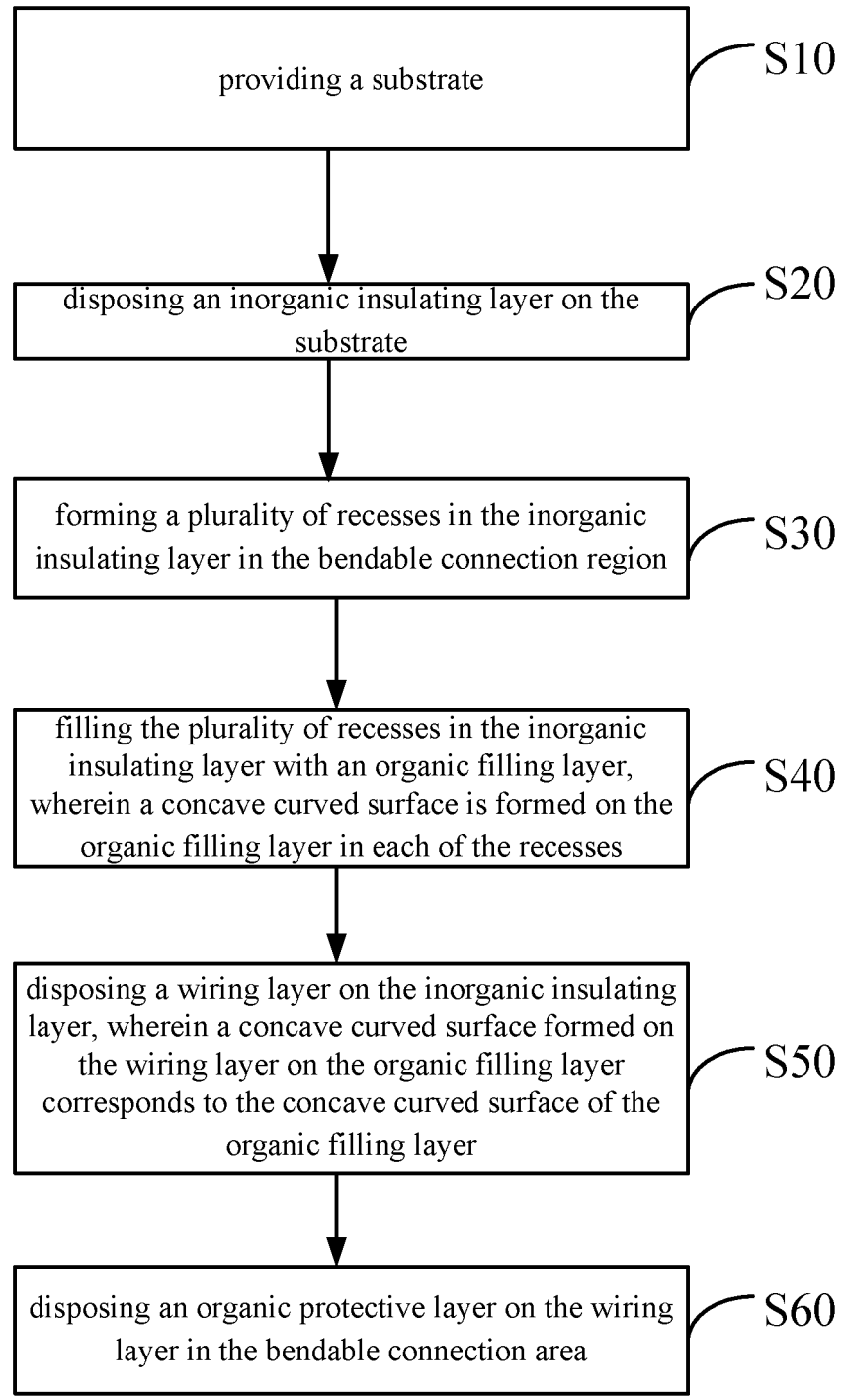
FIG. 3 is a flow chart of a method for manufacturing a display panel in accordance with an embodiment of the present disclosure.
Figure 4:
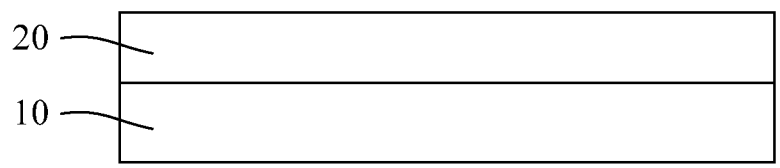
FIG. 4 to FIG. 8 are schematic side views of the display panel in each step of the method for manufacturing the display panel in accordance with the embodiment of the disclosure.
Figure 5:
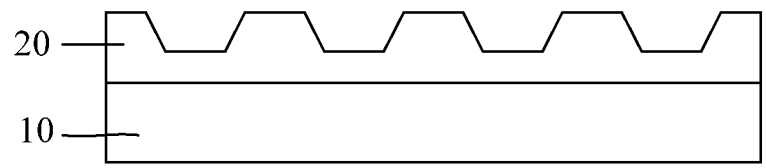
Figure 6:
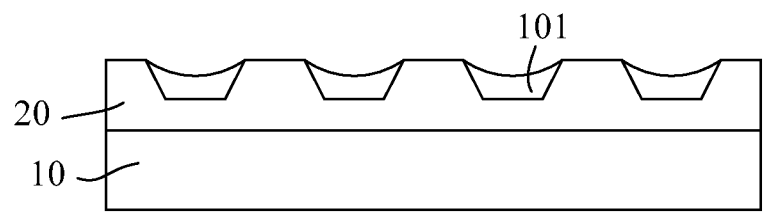
Figure 7:
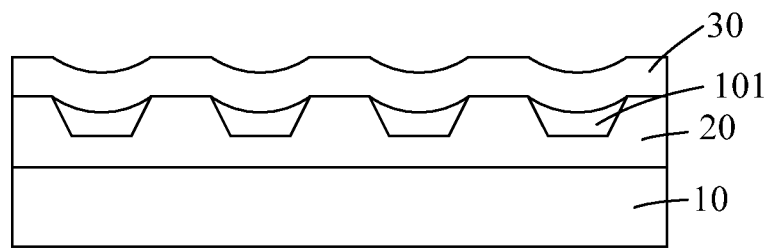
Figure 8:
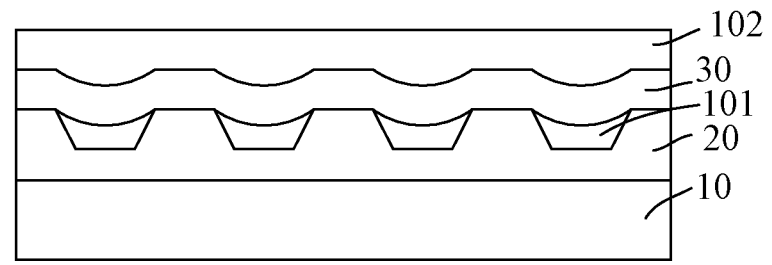

Referring to FIG. 3, which is a flow chart of a method for manufacturing a display panel in accordance with an embodiment of the present disclosure. Referring to FIG. 4 to FIG. 8, which are schematic side views of the display panel in each step of the method for manufacturing the display panel in accordance with the embodiment of the disclosure.

In the present disclosure, a method of manufacturing a display panel 200 is provided. The display panel 200 has a display area 210, a non-display area 220, and a bendable connection area 230. The bendable connection area 230 of the display panel 200 is located between the display area 210 and the non-display area 220, and connects the display area 210 with the non-display area 220. The bendable connection area 230 has wires formed with a wiring layer 30, and electrically connects components in the display area 210 with components in the non-display area 220 to transmit signals to each other.

The method includes the following steps:

a step S10 of providing a substrate 10;

a step S20 of disposing an inorganic insulating layer 20 on the substrate;

a step S30 of forming a plurality of recesses in the inorganic insulating layer 20 in the bendable connection area 230, wherein the plurality of recesses form a pattern;

a step S40 of filling the plurality of recesses in the inorganic insulating layer 20 with an organic filling layer 210, wherein a concave curved surface is formed on the organic filling layer 210 in each of the recesses;

a step S50 of disposing the wiring layer 30 on the inorganic insulating layer 20 to cover the inorganic insulating layer 20 and the organic filling layer 101 in the plurality of recesses, wherein a concave curved surface is formed on the wiring layer 30 on the organic filling layer 101 in each of the recesses along with the concave curved surface of the organic filling layer 101; and a step S60 of disposing an organic protective layer 102 on the wiring layer 30 in the bendable connection area 230 to cover the wiring layer 30.

Specifically, in the step 20, the inorganic insulating layer 20 is disposed on the substrate, the inorganic insulating layer 20 has a thickness of 1 to 100 µm, and material thereof is selected from, but not limited to, SiNx. SiOxNy or SiOx.

Specifically, in the step 30, the plurality of recesses are formed in the inorganic insulating layer 20 in the bendable connection area 230 by a photolithography process, wherein the plurality of recesses form a pattern. A cross-sectional pattern of each of the plurality of recesses is a rectangle, a trapezoid, an inverted trapezoid or a parallelogram. Each of the plurality of recesses is a hole, a polygon recess or a groove. Moreover, after the step S30, before the step (S40), the method further includes a step S34 of performing a plasma treatment ($H_2$, $O_2$, $NH_3$, N, etc.) or an ultraviolet light irradiation treatment on a surface of the inorganic insulating layer 20 at the pattern, such that at the pattern, the surface of the inorganic insulating layer 20 is modified and exhibits hydrophilicity or hydrophobicity.

Specifically, the step S40 includes a step of filling the plurality of recesses in the inorganic insulating layer with the organic filling layer 101 by inkjet printing, wherein the concave curved surface is formed on the organic filling layer in each of the recesses. Specifically, based upon hydrophilicity or hydrophobicity exhibited by the surface modification of the inorganic insulating layer 20, a suitable inkjet material, such as an epoxy resin polymer or an acrylic polymer, is selected. By an inkjet printing process, the plurality of recesses in the inorganic insulating layer 20 are filled with the organic filling layer 101, and the organic filling layer 20 does not overflow the recesses. Afterwards, the organic filling layer 20 is cured, so that the concave curved surface is formed on the organic filling layer 101 in each of the recesses. Therefore, a cross-sectional pattern of the organic filling layer 101 in each of the recesses is a crescent shape. The thickness of the organic filling layer 101 at edges of the plurality of recesses is greater than the thickness of the organic filling layer 101 at the center of the plurality of recesses. In addition, an insulating property is required for the organic filling layer 101.

Specifically, in the step S50, the wiring layer 30 may be disposed on the inorganic insulating layer 20 by physical vapor deposition (PVD) or sputtering, and cover the inorganic insulating layer 20 and the organic filling layer 101 in the plurality of recesses. Material thereof is selected from, but not limited to, Al, Ti, Cu, ITO or IZO. The corresponding concave curved surface is formed on the wiring layer 30 on the organic filling layer 101 in each of the recesses along with the concave curved surface of the organic filling layer 101, and a flat surface is formed on the wiring layer 30 on a portion of the inorganic insulating layer 20 where the recesses are absent.

Specifically, in the step (60), similar to the manner in which the organic filling layer 101 is formed, a suitable inkjet material, such as an epoxy-based polymer or an acrylic-based polymer, is selected. By an inkjet printing process, the organic protective layer 102 is formed on the wiring layer 30 in the bendable connection area to cover the wiring layer 30. The thickness thereof is from 1 to 100 μm. In addition, an insulating property is required for the organic protective layer 102.

In summary, in the method for manufacturing the display panel of the present disclosure, the concave curved surface of the organic filling layer in each of the recesses of the inorganic insulating layer exhibits an uneven crescent shape, thereby making the wires on the inorganic insulating layer longer than the original lengths thereof and improving the bendability thereof. In addition, the organic protective layer is disposed on the wires to cover the wires in the bendable connection area, thereby reducing stresses applied on the wires and the breakage risks, and protecting the wires from the external environment. Furthermore, it is not required to apply a photoresist under the wires, so that a total thickness of the layers in the bendable connection area is reduced, thereby reducing the breakage risks during the bending.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A display panel, having a display area, a non-display area, and a bendable connection area located between the display area and the non-display area and connecting the display area with the non-display area, the display panel comprising:
    a substrate;
    an inorganic insulating layer disposed on the substrate, wherein in the bendable connection area, a plurality of recesses are defined in the inorganic insulating layer and form a pattern;
    an organic filling layer filled in the plurality of recesses in the inorganic insulating layer, wherein a concave curved surface is formed on the organic filling layer in each of the recesses; and
    a wiring layer disposed on the inorganic insulating layer and covering the inorganic insulating layer and the organic filling layer in the plurality of recesses, wherein a corresponding concave curved surface is formed on the wiring layer on the organic filling layer in each of the recesses along with the concave curved surface of the organic filling layer.

2. The display panel as claimed in claim 1, wherein a flat surface is formed on the wiring layer on a portion of the inorganic insulating layer where the recesses are absent.

3. The display panel as claimed in claim 1, further comprising:
    an organic protective layer disposed on the wiring layer in the bendable connection area to cover the wiring layer.

4. The display panel as claimed in claim 1, wherein at the pattern, a surface of the inorganic insulating layer is hydrophilic or hydrophobic.

5. The display panel as claimed in claim 1, wherein a cross-sectional pattern of each of the plurality of recesses is a rectangle, a trapezoid, an inverted trapezoid or a parallelogram.

6. The display panel as claimed in claim 1, wherein each of the plurality of recesses is a hole, a polygon recess or a groove.

7. The display panel as claimed in claim 1, wherein material of the organic filling layer is selected from the group consisting of an epoxy resin polymer and an acrylic polymer.

8. A method for manufacturing a display panel, the display panel having a display area, a non-display area, and a bendable connection area located between the display area and the non-display area and connecting the display area with the non-display area, the method comprising:
    a step S10 of providing a substrate;
    a step S20 of disposing an inorganic insulating layer on the substrate;
    a step S30 of forming a plurality of recesses in the inorganic insulating layer in the bendable connection area, wherein the plurality of recesses form a pattern;
    a step S40 of filling the plurality of recesses in the inorganic insulating layer with an organic filling layer, wherein a concave curved surface is formed on the organic filling layer in each of the recesses;
    a step S50 of disposing a wiring layer on the inorganic insulating layer to cover the inorganic insulating layer and the organic filling layer in the plurality of recesses, wherein a concave curved surface is formed on the wiring layer on the organic filling layer in each of the recesses along with the concave curved surface of the organic filling layer.

9. The method for manufacturing the display panel as claimed in claim 8, wherein a flat surface is formed on the wiring layer on a portion of the inorganic insulating layer where the recesses are absent.

10. The method for manufacturing the display panel as claimed in claim 8, further comprising:
a step S60 of disposing an organic protective layer on the wiring layer in the bendable connection area to cover the wiring layer.

11. The method for manufacturing the display panel as claimed in claim 8, after the step S30, before the step (S40), further comprising:
a step S34 of performing a plasma treatment or an ultraviolet light irradiation treatment on a surface of the inorganic insulating layer at the pattern, such that at the pattern, the surface of the inorganic insulating layer is hydrophilic or hydrophobic.

12. The method for manufacturing the display panel as claimed in claim 8, wherein the step S40 comprises:
a step of filling the plurality of recesses in the inorganic insulating layer with the organic filling layer by inkjet printing, wherein the concave curved surface is formed on the organic filling layer in each of the recesses.

13. A display panel having a display area, a non-display area, and a bendable connection area located between the display area and the non-display area and connecting the display area with the non-display area, the display panel comprising:
a substrate;
an inorganic insulating layer disposed on the substrate, wherein in the bendable connection area, a plurality of recesses are defined in the inorganic insulating layer and form a pattern;
an organic filling layer filled in the plurality of recesses in the inorganic insulating layer, wherein a concave curved surface is formed on the organic filling layer in each of the recesses; and
a wiring layer disposed on the inorganic insulating layer and covering the inorganic insulating layer and the organic filling layer in the plurality of recesses, wherein a corresponding concave curved surface is formed on the wiring layer on the organic filling layer in each of the recesses along with the concave curved surface of the organic filling layer, and a flat surface is formed on the wiring layer on a portion of the inorganic insulating layer where the recesses are absent.

14. The display panel as claimed claim 13, further comprising:
an organic protective layer disposed on the wiring layer in the bendable connection area to cover the wiring layer.

15. The display panel as claimed in claim 13, wherein at the pattern, a surface of the inorganic insulating layer is hydrophilic or hydrophobic.

16. The display panel as claimed in claim 13, wherein a cross-sectional pattern of each of the plurality of recesses is a rectangle, a trapezoid, an inverted trapezoid or a parallelogram.

17. The display panel as claimed in claim 13, wherein each of the plurality of recesses is a hole, a polygon recess or a groove.

18. The display panel as claimed in claim 13, wherein material of the organic filling layer is selected from the group consisting of an epoxy resin polymer and an acrylic polymer.

* * * * *